United States Patent [19]

Iwasa

[11] Patent Number: 4,735,676
[45] Date of Patent: Apr. 5, 1988

[54] METHOD FOR FORMING ELECTRIC CIRCUITS ON A BASE BOARD

[75] Inventor: Yamahiro Iwasa, Hachioji, Japan

[73] Assignee: Asahi Chemical Research Laboratory Co., Ltd., Tokyo, Japan

[21] Appl. No.: 947,437

[22] Filed: Dec. 29, 1986

[30] Foreign Application Priority Data

Jan. 14, 1986 [JP] Japan .................................. 61-5645
Jan. 14, 1986 [JP] Japan .................................. 61-5646

[51] Int. Cl.$^4$ ............................ C23F 1/02; B44C 1/22; B05D 5/12; C25D 5/00
[52] U.S. Cl. .................................... 156/630; 29/620; 29/852; 156/634; 156/645; 156/656; 156/661.1; 156/902; 204/38.4; 204/15; 338/308; 427/97; 427/102; 427/103
[58] Field of Search ............... 156/630, 634, 645, 656, 156/659.1, 902, 661.1, 150, 151; 204/15, 38.4; 427/96–98, 102, 103; 174/68.5; 29/610 R, 620, 852; 338/308

[56] References Cited

U.S. PATENT DOCUMENTS 4,211,603 7/1980 Reed .................................. 156/659.1
4,424,095 1/1984 Frisch et al. ........................ 156/629
4,512,829 4/1985 Ohta et al. ......................... 156/659.1

FOREIGN PATENT DOCUMENTS 2558367 7/1976 Fed. Rep. of Germany ...... 156/902

Primary Examiner—William A. Powell
Attorney, Agent, or Firm—Robert F. Ziems

[57] ABSTRACT

A method for forming a plurality of electrically conductive circuits of at least four laminations on a single base board having copper laminations attached on both sides thereof, for example, wherein the base board is processed to provide a through-hole therein, subjected to a catalyst treatment, etched to provide a plurality of circuits of a first lamination, effectively processed with a plating-resistant resist and an electrically conductive copper paste to provide a circuit of a second lamination on the circuits of the first lamination by making a pre-plating treatment and a subsequent chemical treatment applied to the copper paste. The base board is then coated again with the plating-resistant resist except a part of the circuits of the first lamination formed around the through-hole, subjected to an activation treatment and then to a nonelectrolytic copper plating applied to the inner periphery of the through-hole to provide thereon a copper plating layer for electrically connecting the circuits of the first lamination on both sides of the base board.

6 Claims, 12 Drawing Sheets

METHOD FOR FORMING ELECTRIC CIRCUITS ON A BASE BOARD

BACKGROUND OF THE INVENTION

The invention relates to a method for forming electrically conductive circuits on a base board, and more particularly relates to a method for forming at least four laminations of circuits on the base board, wherein a newly developed electrically conductive copper paste, which is specifically adapted to metal plating, is effectively utilized to form so many laminations of circuits on a single base board, the so many laminations of circuits including a resistor circuit by way of a resistor paste or an electricity storing circuit of a dielectric paste. The finished print-circuit board is extremely thin to the merit thereof.

So far it has been general to form a resistor circuit or an electricity storing circuit on a copper laminated base board by soldering a lead or a chip-shaped resistor or a condenser onto the copper laminated base board. The finished product is therefore bulky in addition to requiring so many precessing steps and the resultant high cost including the cost of the resistor or a condenser. Further according to the conventional method, the loading density of the print-circuit base board is lower, and the reduction of product weight and of production process is difficult. Moreover since the soldering operation is required, there have often been a misarrangement of leads and a misinsertion of the resistor or the condenser.

Further in case of forming considerably complex circuits on the copper laminated base board, it becomes necessary to electrically connect the circuits to each other. According to the prior art, a through-hole is provided to electrically connect the circuits on both sides of the base board because it has been impossible to form the circuits of more than two laminations on one side of the base board. Even if the through-hole is provided, it has been impossible to form more than two laminations of circuits, that is, one located on one side of the base board and the other located on the other thereof.

It has been proposed to form more than two laminations of circuits on one side of a ceramics base board. For example, in case of the hybrid IC, it is general to employ a paste of precious metal such as platinum-palladium or silver-palladium to form the circuits and the terminals thereof, and to employ a paste of ruthenium oxide to form a resistor and then to burn the base board at a high temperature (700° C.–1000° C.). Further it has been proposed to form more than two laminations of circuits on one side of a base board by printing a tungsten (W paste) and an isolating paste alternately on an alumina green sheet and then by burning the alumina green sheet at a temperature of about 1600° C. However according to such methods requiring a high temperature burning treatment, the ingredients of circuit structure to be used are limited and the equipment to be required is costly. The methods are therefore not suitable to produce the print-circuit boards to be generally used in combination with the electronic apparatuses.

It is therefore desired to industrially set up a method for forming more than two laminations of circuits on one side of a pol.ymer base board which may be treated at a lower temperature. In this case, it becomes necessary to develop on electrically conductive copper paste which has a property of electrically high conductivity and is specifically adapted to a metal plating, especially to a copper plating and which may be obtained at a lower cost. It has however been difficult to practically use the electrically conductive paste, because the copper perticles in the paste may be easily oxidized when the paste is heated to be hardened at a temperature of approximately 150°, and the paste will have a high electric resistance and reduce the soldering property. Generally the conventional electrically conductive copper paste is easily oxidized with a heat for hardening the paste, in contrast to the precious metal such as silver. The oxidization of copper powder in the paste will increase the electric resistance and decrease the soldering property. These defects have made the conventional electrically conductive paste practically useless. Further it has been required to activate the surface of the hardened electrically conductive copper paste by means of a catalyst so as to expose the copper powder from the resin paste so that the exposed copper powder may act as the binder, that is, so many neucleuses for the subsequent metal plating. Thus the conventional electrically conductive paste has required so many processing steps.

The Japanese utility model application No. 50-932 (publication No. 55-42460) discloses a specific method, in which a high dielectric resist of polybutadiene is used as a dilectric coat, an adhesive paste, for example, of 20% of phenol resin, 63% of copper powder and 17% of solvent is used to form designed circuits, the adhesive paste is thickened up to 20 $\mu$ by means of a non-electrolytic plating, and then the plated adhesive paste is coated with copper so as to form the electrically conductive circuits of more than two layers on one side of a base board. The mentioned specific method has never been industrially reduced to practice.

The applicant has been engaged in studying new electrically conductive copper pastes for many years to eliminate the defects of the prior art as mentioned above and succeeded to provide such new electrically conductive copper pastes to be industrially employed. The newly developed electrically conductive copper pastes includes the electrically conductive copper paste ACP-020, ACP-030 and ACP-007P of Asahi Chemical Research Laboratory Co., Ltd.. The electrically conductive copper paste ACP-020 is substantially composed of 80% by weight of copper powder and 20% by weight of synthetic resin, and is extremely excellent in the electric conductivity, but more or less deteriorated in the soldering property. The electrically conductive copper paste ACP-030 is substantially composed of 85% by weight of copper powder and 15% by weight of synthetic resin, and is slightly lower than the ACP-020 as to the electric conductivity, but excellent in the soldering property. In the last place, the electrically conductive copper paste ACP-007P is an improvement of the ACP-030 and may be subjected to a metal plating such as a copper chemical plating without using a catalyst. Namely the copper paste is extremely excellent in the metal plating property.

OBJECTS OF THE INVENTION

The invention has been provided to eliminate the defects and disadvantages of the prior art. It is therefore an object of the invention to effectively use the newly developed electrically conductive copper paste having the specially excellent metal plating property to form electrically conductive circuits of more than two laminations on one side of a copper laminated base board, that is, to firstly form a first lamination circuit on the copper lamination of the base board, subsequently to coat the mentioned electrically conductive copper paste of excellent metal plating property on the parts of the first lamination circuits which are to be connected to a second layer circuits to be formed on the first lamination circuits, subsequently to heat the electrically conductive paste to harden the same, subsequently to apply a metal plating on the coated electrically conductive copper paste to increase the electric conductivity of the copper paste up to that of the copper lamination, to thereby form the second lamination circuits on the first layer circuits.

In this way, the circuits of at least two laminations may be formed on one side of the copper laminated base plate, and accordingly the circuits of at least four laminations may be formed on both sides of the base board, which are electrically connected to each other by means of a through-hole. Thus the finished product may be provided at a cost almost a half of the cost required to produce the conventional product.

It is another object of the invention to provide the circuits of at least four laminations on both sides of the copper laminated base board including a resistor circuit on each side thereof, wherein a resistor paste of a predetermined value of electric resistance is coated on a plating-resistant resist on both sides of the base board, and is then heated to be hardened. An electrically conductive paste is then coated o both sides of the base board in a manner as to electrically connect to the resistor paste at least two circuits of first lamination located on both side of the resistor paste or the circuit of second lamination on one side of the resistor paste. The electrically conductive paste is then heated to be hardened to thereby form a resistor circuit on each side of the base board. An activation treatment is performed to the inner periphery of the through-hole, and then a non-electrolytic copper plating is performed on the inner periphery of the through-hole to provide thereat a copper plating layer to electrically connect the circuits of first lamination on both sides of the base board. Thus the circuits of at least four laminations are formed on both sides of the base board including the resistor circuit. In this case, no operation is needed to insert a resistor element into the base board or to attach and solder the resistor element to the base board. Thus an extremely thin resistor circui is obtained.

It is still another object of the invention to form the circuits of at least four laminations on both sides of the copper laminated base board including an electricity storing circuit, wherein a dielectric paste having a property of storing electricity is coated on a part of a circuit of first or second lamination on each side of the base board, and then is heated to be hardened. An electrically conductive paste is then coated on both sides of the base board in a manner as to electrically connect to the dielectric paste another circuit of first or second lamination on each side of the base board. The electrically conductive paste is then heated to be hardened to form thereat an electricity storing circuit on each side of the base board. An activation treatment is then performed to the inner periphery of the through-hole, and then a non-electrolytic copper plating is performed on the inner periphery of the through-hole to provide thereat a copper plating layer to electrically connect the circuits of first lamination on both sides of the base board. Thus the circuits of at least four laminations are formed on both sides of the base board including the electricity storing circuit on each side of the base board. In this case, no operation is needed to insert a condenser into the base board or to attach and solder the condenser to the base board. Thus an extremely thin electricity storing circuit may be obtained.

It is still another object of the invention to provide a reliable print circuit board having the circuits of at least four laminations formed on both sides thereof including a resistor circuit or an electricity storing circuit on each side thereof, the print-circuit board having a high loading density with reduction of weight and being produced in an extremely reduced processes without possible misarrangement of leads or misinsertion of a resistor element or a condenser.

SUMMARY OF THE INVENTION

In short, the invention comprises the steps of:
(a) attaching copper laminations on both sides of said base board to provide a copper laminated base board;
(b) processing said copper laminated base board to provide a through-hole extending all through the thickness of said copper laminated base board;
(c) performing a catalyst treatment of said copper laminated base board;
(d) washing said copper laminated base board;
(e) etching both sides of said copper laminated base board to form thereon a plurality of circuits of first lamination including a circuit formed around said through-hole on each side of said copper laminated base board;
(f) coating a plating-resistant resist on both sides of said copper laminated base board except the circuits of first lamination;
(g) heating said copper laminated base board to harden said plating-resistant resist;
(h) coating an electrically conductive copper paste on both sides of said copper laminated base board in a manner as to electrically connect at least two circuits of first lamination on each sides of said copper laminated base board;
(i) heating said copper laminated base board to harden said electrically conductive copper paste;
(j) making a pre-plating treatment to said copper laminated base board;
(k) performing a chemical copper plating on the surface of said electrically conductive paste of said copper laminated base board to provide thereat a circuit of second lamination on each side of said copper laminated base board;
(l) coating said plating-resistant resist on both sides of said copper laminated base board except a part of said circuits of first lamination formed around said through-hole;
(m) heating said copper laminated base board to harden said plating-resistant resist;
(n) performing an activation treatment to the inner periphery of said through-hole; and
(o) performing a non-electrolytic copper plating on said inner periphery of said through-hole to provide thereat a copper plating layer to electrically connect said circuits of first lamination on both sides of said copper laminates base board.

Another aspect of the invention comprises the steps of:
(a) attaching copper laminations on both sides of said base board to provide a copper laminated base board;

(b) processing said copper laminated base board to provide a through-hole extending all through the thickness of said copper laminated base board;

(c) performing a catalyst treatment of said copper laminated base board;

(d) washing said copper laminated base board;

(e) etching both sides of said copper laminated base board to form thereon a plurality of circuits of first lamination including a circuit formed around said through-hole on each side of said copper laminated base board;

(f) coating a plating-resistant resist on both sides of said copper laminated base board except said circuits of first lamination;

(g) heating said copper laminated base board to harden said plating-resistant resist;

(h) coating an electrically conductive copper paste on both sides of said copper laminated base board in a manner as to electrically connect at least two circuits of first lamination on each side of said copper laminated base board;

(i) heating said copper laminated base board to harden said electrically conductive copper paste;

(j) making a pre-plating treatment to said copper laminated base board;

(k) performing a chemical copper plating on the surface of said electrically conductive copper paste of said copper laminated base board to provide thereat a circuit of second lamination on each side of said copper laminated base board;

(l) coating a resistor paste on said plating-resistant resist of a predetermined electric resistance value on both sides of said copper laminated base board;

(m) heating said copper laminated base board to harden said resistor paste;

(n) coating an electrically conductive paste on both sides of said copper laminated base board in a manner as to electrically connect to said resistor paste at least two of said circuits of first lamination located on both sides of said resistor paste or said circuit of second lamination located on one side of said resistor paste on each side of said copper laminated base board;

(o) heating said copper laminated base board to harden said electrically conductive paste to form thereat a resistor circuit on each side of said copper laminated base board;

(p) coating said plating-resistant resist on both sides of said copper laminated base board except a part of said circuits of first lamination formed around said through-hole;

(q) heating said copper laminated base board to harden said plating-resistant resist;

(r) performing an activation treatment to the inner periphery of said through-hole; and (s) performing a non-electrolytic copper plating on said inner periphery of said through-hole to provide thereat a copper plating layer to electrically connect said circuits of first lamination on both sides of said copper laminated base board.

Another aspect of the invention comprises the steps of:

(a) attaching copper laminations on both sides of said base board to provide a copper laminated base board;

(b) processing said copper laminated base board to provide a through-hole extending all through the thickness of said copper laminated base board;

(c) performing a catalyst treatment of said copper laminated base board;

(d) washing said copper laminated base board;

(e) etching both side of said copper laminated base board to form thereon a plurality of circuits of first lamination including a circuit formed around said through-hole on each side of said copper laminated base board;

(f) coating a plating-resistant resist on both sides of said copper laminated base board except said circuits of first lamination;

(g) heating said copper laminated base board to harden said plating-resistant resist;

(h) coating an electrically conductive copper paste on both sides of said copper laminated base board in a manner as to electrically connect at least two circuits of first lamination on each side of said copper laminated base board;

(i) heating said copper laminated base board to harden said electrically conductive copper paste;

(j) making a pre-plating treatment to said copper laminated base board;

(k) performing a chemical copper plating on the surface of said electrically conductive copper paste of said copper laminated base board to provide thereat a circuit of second lamination on each side of said copper laminated base board;

(l) coating a dielectric paste having a property of storing electricity on a part of one of said circuits of first lamination or of second lamination on each side of said copper laminated base board;

(m) heating said copper laminated base board to harden said dielectric paste;

(n) coating an electrically conductive paste on both sides of said copper laminated base board in a manner as to electrically connect to said dielectric paste one of said circuits of first lamination located adjacent thereto or said circuit of second lamination on each side of said copper laminated base board;

(o) heating said copper laminated base board to harden said electrically conductive paste to form thereat an electricity storing circuit on each side of said copper laminated base board;

(p) coating said plating-resistant resist on both sides of said copper laminated base board except a part of said circuits of first lamination formed around said through-hole;

(q) heating said copper laminated base board to harden said plating-resistant resist;

(r) performing an activation treatment to the inner periphery of said through-hole; and (s) performing a non-electrolytic copper plating on said inner periphery of said through-hole to provide thereat a copper plating layer to electrically connect said circuits of first lamination on both sides of said copper laminated base board.

Another aspect of the invention comprises the steps of:

(a) applying an adhesive on both sides of said base board to provide an adhesive-applied base board;

(b) processing said adhesive-applied base board to provide a through-hole extending all through the thickness of said base board;

(c) performing a catalyst treatment of said base board;

(d) coating a plating-resistant on predetermined portions on both sides of said base board;

(e) heating said base board to harden said plating-resistant resist;

(f) performing a non-electrolytic copper plating on the portions having no plating-resistant resist is coated thereon on both sides of said base board, and on the inner periphery of said through-hole, to thereby provide thereat a copper plating layer in formation of a plurality of circuits of first lamination which are electrically connected on each other on both sides of said base board;

(g) coating said plating-resistant resist on the portions having said plating-resistant resist has been coated thereon and/or the parts of said circuits of first lamination on both sides of said base board;

(h) heating said base board to harden said plating-resistant resist;

(i) coating an electrically conductive copper paste on said portions having said plating-resistant resist repeatedly coated thereon;

(j) heating said base board to harden said electrically conductive copper paste;

(k) performing a pre-plating treatment of said base board; and (l) performing a chemical copper plating on the surface of said electrically conductive copper paste to provide thereat a plurality of circuits of second lamination on both sides of said base board.

Another aspect of the invention comprises the steps of:

(a) applying an adhesive on both sides of said base board to provide an adhesive-applied base board;

(b) processing said adhesive-applied base board to provide a through-hole extending all through the thickness of said base board;

(c) performing a catalyst treatment of said base board;

(d) coating a plating-resistant resist on predetermined portions on both sides of said base board;

(e) heating said base board to harden said plating-resistant resist;

(f) performing a non-electrolytic copper plating on the portions having no plating-resistant resist is coated thereon on both sides of said base board, and on the inner periphery of said through-hole, to thereby provide thereat a copper plating layer in formation of a plurality of circuits of first lamination which are electrically connected to each other on both sides of said base board;

(g) coating said plating-resistant resist on the portions having said plating-resistant resist has been coated thereon and/or the parts of said circuits of first lamination on both sides of said base board;

(h) heating said base board to harden said plating-resistant resistant resist;

(i) coating an electrically conductive copper paste on said portions having said plating-resistantresistant resist repeatedly coated thereon;

(j) heating said base board to harden said electrically conductive copper paste;

(k) performing a pre-plating treatment of said base board; and (l) performing a chemical copper plating on the surface of said electrically conductive copper paste to provide thereat a plurality of circuits of second lamination on both sides of said base board.

(m) coating a resistor paste having a predetermined value of electric resistance on at least one of the portions having said plating-resistantresistant resist coated thereon on each side of said base board;

(n) heating said base board to harden said resistor paste;

(o) coating an electrically conductive paste on both sides of said base board in a manner as to electrically connect to said resistor paste the circuits of first or second lamination located on both sides of said resistor paste on each side of said base board; and (p) heating said base board to harden said electrically conductive paste to form a resistor circuit on each side of said base board.

Still another aspect of the invention comprises the steps of:

(a) applying an adhesive on both sides of said base board to provide an adhesive-applied base board;

(b) processing said adhesive-applied base board to provide a through-hole extending all through the thickness of said base board;

(c) performing a catalyst treatment of said base board;

(d) coating a plating-resistant resist on predetermined portions on both sides of said base board;

(e) heating said base board to harden said plating-resistant resist;

(f) performing a non-electrolytic copper plating on the portions having no plating-resistant resist is coated thereon on both sides of said base board, and on the inner periphery of said through-hole, to thereby provide thereat a copper plating layer in formation of a plurality of circuits of first lamination which are electrically connected to each other on both sides of said base board;

(g) coating said plating-resistant resist on the portions having said plating-resistant resist has been coated thereon and/or the parts of said circuits of first lamination on both sides of said base board;

(h) heating said base board to harden said plating-resistant resistant resist;

(i) coating an electrically conductive copper paste on said portions having said plating-resistant resist repeatedly coated thereon;

(j) heating said base board to harden said electrically conductive copper paste;

(k) performing a pre-plating treatment of said base board; and (l) performing a chemical copper plating on the surface of said electrically conductive copper paste to provide thereat a plurality of circuits of second lamination on both sides of said base board.

(m) coating a dielectric paste having a property of storing electricity on a part of one of said circuits of first or second lamination on each side of said base board;

(n) heating said base board to harden said dielectric paste;

(o) coating an electrically conductive paste on both sides of said base board in a manner as to electrically connect to said dielectric paste at least one of said circuits of first or second lamination located adjacent to said dielectric paste; and (p) heating said base board to harden said electrically conductive paste to form thereat an electricity storing circuit on each side of said base board.

The other features and advantages of the invention will be apparent from the following description of the embodiments in reference to the attached drawings.

BRIEF DESCRIPTION OF THE DRAWINGS

FIGS. 1-11 show a first embodiment of the invention, of which:

FIG. 1 is a copper laminated base board shown in vertical section;

FIG. 2 is the copper laminated base board shown in vertical section and having a through-hole provided therein;

FIG. 3 is the copper laminated base board shown in vertical section and having a catalyst treatment applied thereto;

FIG. 4 is the copper laminated base board shown in vertical section and washed and dried;

FIG. 5 is the copper laminated base board shown in vertical section and having an etching resistant resist coated thereon;

FIG. 6 is the copper laminated base board shown in vertical section and having an etching treatment applied thereto to form thereat the circuits of first lamination;

FIG. 7 is the copper laminated base board shown in vertical section and having a plating-resistant resist coated thereon;

FIG. 8 is the copper laminated base board shown in vertical section and having an electrically conductive copper paste coated thereon;

FIG. 9 is the copper laminated base board shown in vertical section and having a chemical copper plating applied thereto;

FIG. 10 is the copper laminated base board shown in vertical section and having a plating-resistant resist coated thereon;

FIG. 11 is the copper laminated base board shown in vertical section and having a non-electrolytic copper plating applied to the inner periphery of the through-hole;

FIGS. 12 through 15 show a second embodiment of the invention, of which:

FIG. 12 is the copper laminated base board as shown in FIG. 9, but having a resistor paste coated thereon;

FIG. 13 is the copper laminated base board shown in vertical section and having an electrically conductive paste coated thereon;

FIG. 14 is the copper laminated base board shown in vertical section and having a plating-resistant resist coated thereon;

FIG. 15 is the copper laminated base board shown in vertical section and having a non-electrolytic copper plating applied to the inner periphery of the through-hole;

FIGS. 16 through 19 show a third embodiment of the invention, of which:

FIG. 16 is the copper laminated base board as shown in FIG. 9, but having a dielectric paste coated thereon;

FIG. 17 is the copper laminated base board shown in vertical section and having an electrically conductive paste coated thereon;

FIG. 18 is the copper laminated base board shown in vertical section and having a plating-resistant resist coated thereon;

FIG. 19 is the copper laminated base board shown in vertical section and having a non-electrolytic copper plating applied to the inner periphery of the through-hole;

FIGS. 20 through 28 show a fourth embodiment of the invention, of which:

FIG. 20 is an adhesive-applied base board shown in vertical section;

FIG. 21 is the adhesive-applied bas board shown in vertical section and having a through-hole provided therein;

FIG. 22 is the adhesive-applied base board shown in vertical section and having a catalyst treatment applied thereto;

FIG. 23 is the adhesive-applied base board shown in vertical section and having a plating-resistant resist coated thereon;

FIG. 24 is the adhesive-applied base board shown in vertical section an.d having a non-electrolytic copper plating applied thereon to provide thereat the circuits of first lamination;

FIG. 25 is the adhesive-applied base board shown in vertical section and having a plating-resistant resist coated thereon;

FIG. 26 is the adhesive-applied base board shown in vertical section and having an electrically conductive copper paste coated thereon;

FIG. 27 is the adhesive-applied base board shown in vertical section and having a chemical copper plating applied thereon;

FIG. 28 is the adhesive-applied base board shown in vertical section and having an overcoat coated thereon;

FIGS. 29 through 31 show a fifth embodiment of the invention, of which:

FIG. 29 is the adhesive-applied base board as shown in FIG. 27, but having a resistor paste coated thereon;

FIG. 30 is the adhesive-applied base board shown in vertical section and having an electrically conductive paste coate thereon;

FIG. 31 is the adhesive-applied base board shown in vertical section and having an overcoat coated thereon;

FIGS. 32 through 34 show a sixth embodiment of the invention, of which:

FIG. 32 is the adhesive-applied base board as shown in FIG. 27, but having a dielectric paste coated thereon;

FIG. 33 is the adhesive-applied base board shown in vertical section and having an electrically conductive paste coated thereon; and FIG. 34 is the adhesive-applied base board shown in vertical section and having an overcoat coated thereon.

Figure 1:
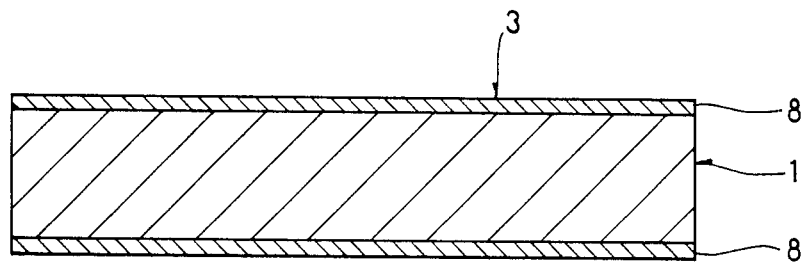
Figure 2:
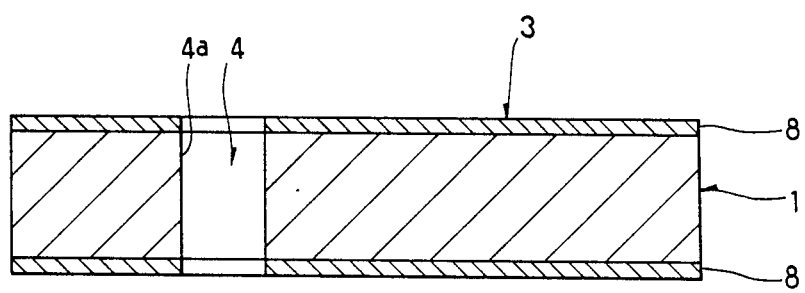
Figure 3:
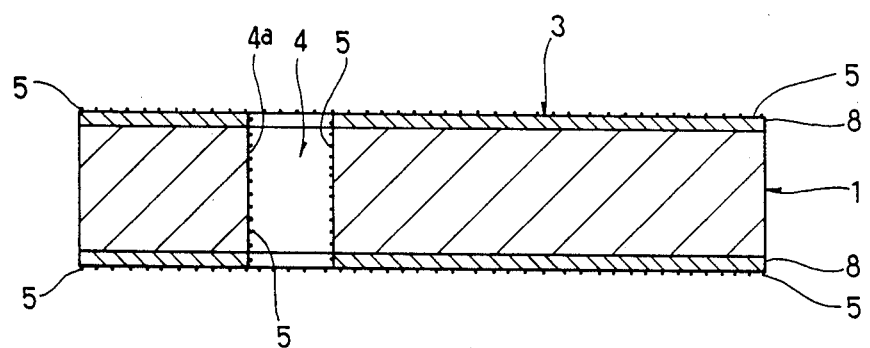

In reference to FIGS. 1 through 11, a polymer base board 1 has copper laminations 8 attached to base sides thereof, and thus formed up as a copper laminated base board 3 as shown in FIG. 1. The copper laminated base board 3 is then processed so as to have a through-hole 4 extending therethrough in the vertical direction as shown in FIG. 2. The copper laminated base board 3 is then treated with a catalyst so as to be provided with metal particles 5 as indicated by dots on both sides thereof and on the inner periphery 4a of through-hole 4 as shown in FIG. 3.

The catalyst treatment of the copper laminated base board 3 is made with a catalyst of palladium chloride ($Pdcl_2$) and tin chloride ($Sncl_2$) or an alkali catalyst solution of palladium only, and then the metal particles 5 of palladium are attached on the faces of the copper laminated base board 3 as mentioned above. The metal particles 5 are used as the nucleuses to expose the copper therearound in the subsequent non-electrolytic copper plating. Since both palladium and copper are a metal and little energy is required to provide a surface between the two substances and have the atomic arrangements of a substantially same period (both are of the face-centered cubic lattice and the lattice constants are approximating such as 3.8898 Å and 3.6150 Å respectively), the copper is progressively exposed on the colloid palladium in the non-electrolytic copper plating and thus the copper plating may be applied on the metal particles 5.

Now in the description, it is to be noted that the method for performing a chemical copper plating after the catalyst treatment has been made is called a "non-electrolytic copper plating" herein, and the method for performing a chemical copper plating on an electrically conductive copper paste without making a catalyst treatment thereon is called a "chemical copper plating" herein.

Figure 4:
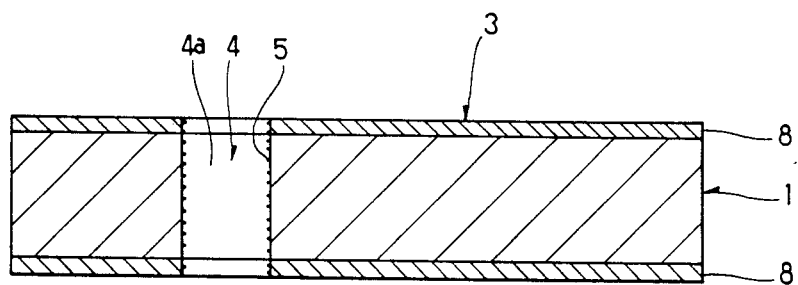
Figure 5:
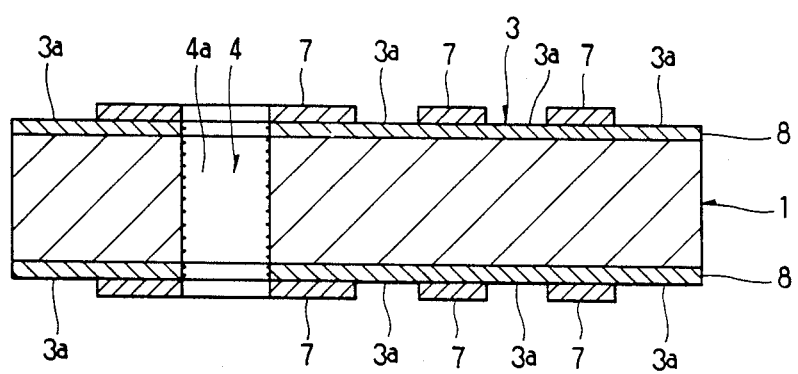
Figure 6:
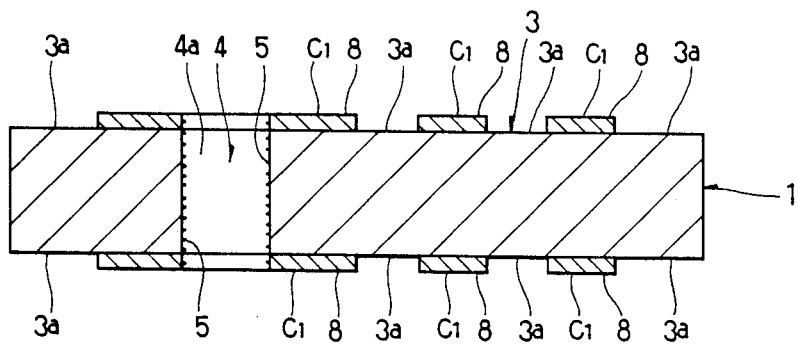

After the catalyst treatment has been finished, the coppe laminated base board 3 is washed and is then dried as shown in FIG. 4. Thus the metal particles 5 are eliminated from the copper laminated base board 3 except the metal particles attached to the inner periphery 4a of the through-hole 4. An ethcing-resistant resist 7 is coated on both sides of the copper laminated base board 3 except the predetermined portions 3a thereof which remain to have no electrically conductive circuits $C_1$ of first lamination formed thereon as shown in FIG. 5. Then the copper laminated base board 3 is processed with etching to form on both sides thereof a plurality of electrically conductive circuits $C_1$ of first lamination by means of the copper laminations 8 as shown in FIG. 6. In this case, one of the circuits $C_1$ of first lamination is designed to be formed around the through-hole 4 on each side of the copper laminated base board 3.

Figure 7:
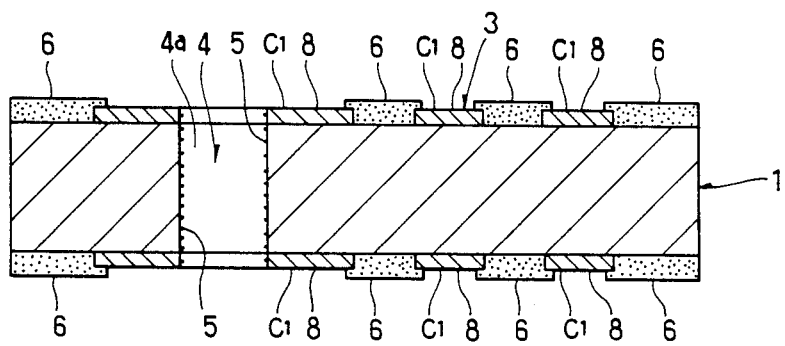
Figure 8:
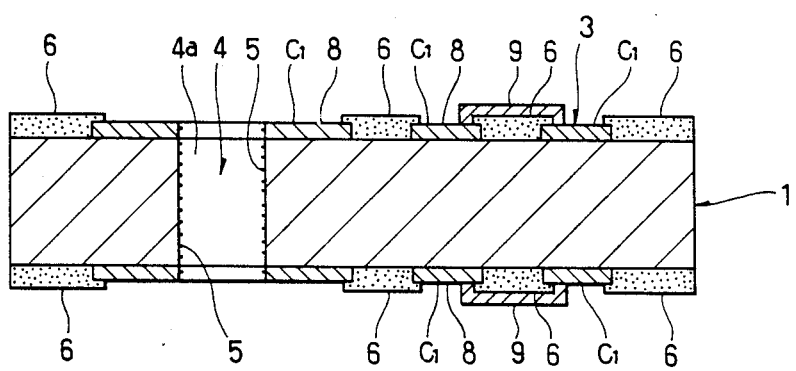

Then a plating-resistant resist 6 is coated on the portions 3a of the copper laminated base board 3 where no circuits $C_1$ of first lamination are formed as shown in FIG. 7, the resist 6 being, for example, the plating-resistant resist CR-2001 developed by Asahi Chemical Research Laboratory Co., Ltd.. The copper laminated base board 3 is then heated at the temperature 150° C. by way of example for about 30 minutes so as to be hardened. Then, as shown in FIG. 8, an electrically conductive copper paste 9, for example, the electrically conductive copper paste ACP-007P developed by Asahi Chemical Research Laboratory Co., Ltd. is coated on both sides of the copper laminated base board 3 by way of a screen printing in a manner that at least two of the electrically conductive circuits $C_1$ may be electrically connected to each other on both sides of the base board 3, and then the copper laminated base board 3 is heated at the temperature 150° C. for 30–60 minutes so as to be hardened.

The copper laminated base board 3 is then processed with a pre-plating treatment. Namely the base board 3 is washed for several minutes with a water solution of 4–5% by weight of caustic soda (NaOH) by way of example, and then is applied with a surface treatment for several minutes by means of a water solution of 5–10% by weight of hydrochloric acid (HCl). With this surface treatment, many copper particles are exposed on the surface of the electrically conductive copper paste 9 from among the binder thereof, which may be used as the nucleuses in the next process of copper plating. In this case, it is noted that the catalyst treatment is not needed which may otherwise be needed in the normal non-electrolytic copper plating.

Figure 9:
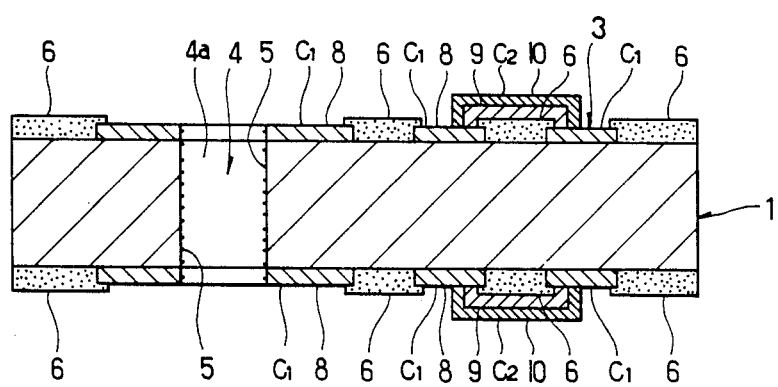

In the next place, the copper laminated base board 3 is immersed in a chemical copper plating bath to perform a chemical copper plating on the surface of the electrically conductive copper paste 9 as shown in FIG. 9. As the result, copper plating layers 10 are provided in formation of the electrically conductive circuits $C_2$ of second lamination provided on both sides of the copper laminated base board 3, each of which is electrically connected to at least two electrically conductive circuits $C_1$ of first lamination adjacent thereto. This chemical copper plating bath is pH 11–13 and is of the temperature 65° C.–75° C., and the thickness of the copper plating layer 10 is more than 5 μm with a plating speed being 1.5 μm–3 μm per hour.

Figure 10:
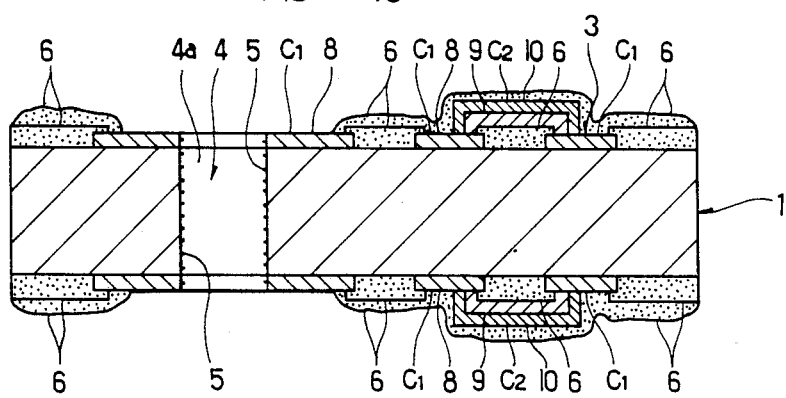
Figure 11:
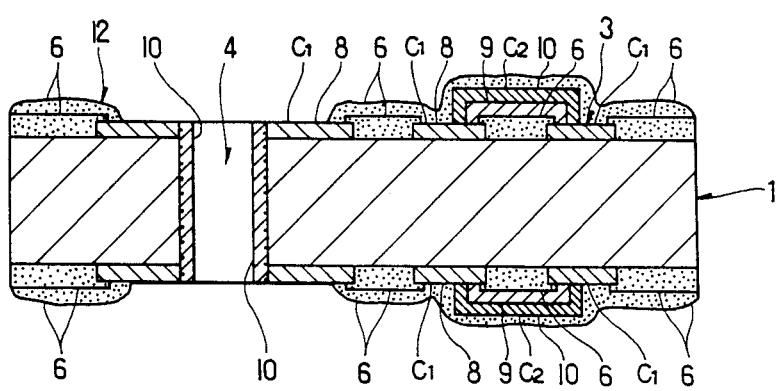

Subsequently the plating-resistant resist 6 is coated on both sides of the base board 3 except the through-hole 4 and the circuits $C_1$ of first lamination formed around the through-hole 4, and then the base board is heated to harden the resist 6. Then an activation treatment is made to the inner periphery 4a of the through-hole 4 as shown in FIG. 10, and then a non-electroanalytic copper plating is performed to the inner perphery 4a to form thereat a copper plating layer 10 to electrically connect the circuits $C_1$ of first lamination each located around the through-hole 4 on both sides of the copper laminated base board 3. In this way, at least four-lamination circuits $C_1$, $C_2$ are formed on both sides of the copper laminated base board 3 as shown in FIG. 11. In this case, the circuits $C_1$ formed around the through-hole 4 on both sides of the copper laminated base board 3 are electrically connected to each other by the copper plating layer 10 formed on the inner periphery 4a of the through-hole 4.

Thus the electrically conductive circuits $C_2$ of second lamination are formed with the copper plating layer 10 and the electrically conductive copper paste 9 on both sides of the copper laminated base board 3, and the circuits $C_1$, $C_2$ of at least four laminations are formed on both sides of the copper laminated base board 3, and thus a print-circuit base board 12 is finished up as shown in FIG. 11.

In this invention, it is understood that a subtractive method and an additive method are properly combined to easily form the circuits $C_1$, $C_2$ of at least four laminations on both sides of the copper laminated base board 3.

Now in reference to FIGS. 1 through 9 and FIGS. 12 through 15, a second embodiment of the invention will be explained with the same reference numerals with the aforementioned first embodiment with respect the parts common to both embodiments. In the second embodiment the processes are same with the first embodiment until the circuits $C_1$, $C_2$ of first and second laminations are formed on both sides of the copper laminated base board 3 in FIG. 9. Therefore the explanation of the processes is omitted therein, and the explanation of the processes from FIGS. 12 through 15 to form a resistor circuit will be made hereunder.

Figure 12:
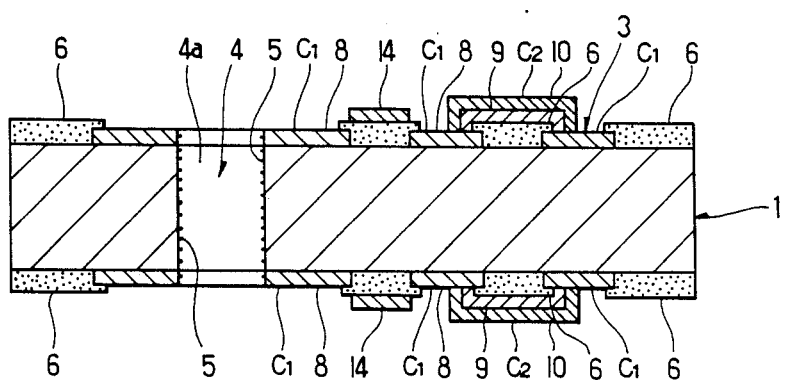
Figure 13:
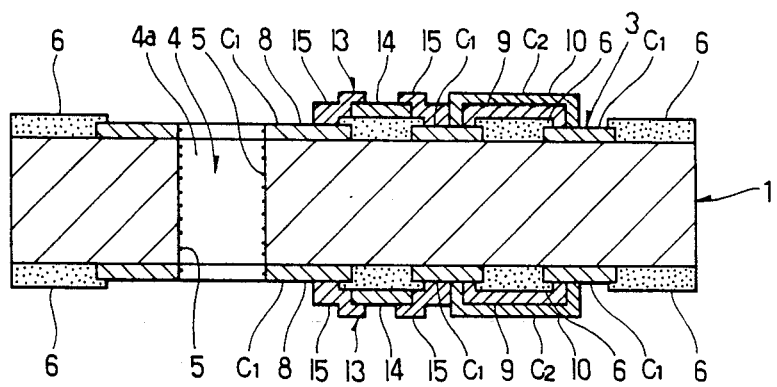

As shown in FIG. 12, a resistor paste 14 of a predetermined value of electric resistance is coated on the optional plating-resistant resist 6 on both sides of the copper laminated base board 3, and then the base board 3 is heated to harden the resistor paste 14. Then as shown in FIG. 13, an electrically conductive paste 15 such as a silver paste is coated on both sides of the copper laminated base board 3 in a manner as to electrically connect the circuits $C_1$ of first lamination located on both sides laterally of each resistor paste 14, and is heated to be hardened so as to form resistor circuits 13 on both sides of the copper laminated base board 3. Thus the copper laminated base board 3 has the circuits $C_1$, $C_2$ of at least four laminations including the resistor circuit 13 formed on both sides thereof.

Figure 14:
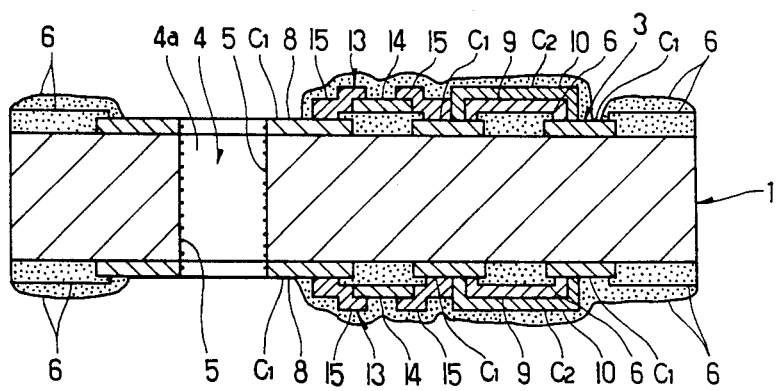
Figure 15:
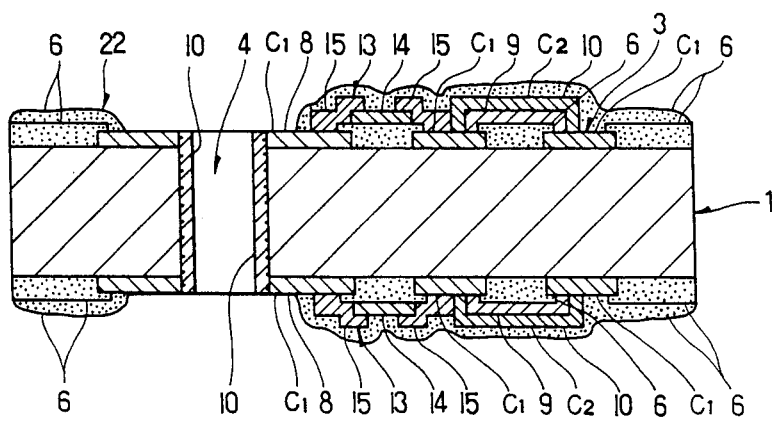

Subsequently as shown in FIG. 14, the plating-resistant resist 6 is. coated on both sides of the copper laminated base board except the through-hole 4 and the circuits $C_1$ of first lamination formed around the through-hole 4 in the same manner as in FIG. 10 of the first embodiment, and then is heated to be hardened. In the next place an activation treatment is performed to the inner periphery 4a of the through-hole 4, and then a non-electroanalytic copper plating is performed to provide thereat the copper plating layer 10 to electrically connect the circuits $C_1$ of first lamination each located around the through-hole 4 on both sides of the copper laminated base board 3 as shown in FIG. 15. In this way, the circuits $C_1$, $C_2$ of at least four laminations including the resistor circuit 13 are formed on both sides of the copper laminated base board 3, and a print-circuit base board 22 is finished up. Thus according to the second embodiment, the circuits $C_1$, $C_2$ of at least four laminations including the resistor circuit 13 are formed on both sides of the copper laminated base board 3 by means of the proper combination of the subtractive method and the additive method Now in reference to FIGS. 1 through 9 and FIGS. 16 through 19, a third embodiment of the invention will be explained with the same reference numerals with the aforementioned first and second embodiments with respect to the parts common to the three embodiments. In the third embodiment, the processes are same with the first and second embodiments until the circuits $C_1$, $C_2$ of first and second laminations are formed on both sides of the copper laminated base board 3 in FIG. 9. Therefore the explanation of the processes is omitted herein, and the explanation of the processes from FIGS. 16 through 19 to form an electricity storing circuit will be made hereunder.

Figure 16:
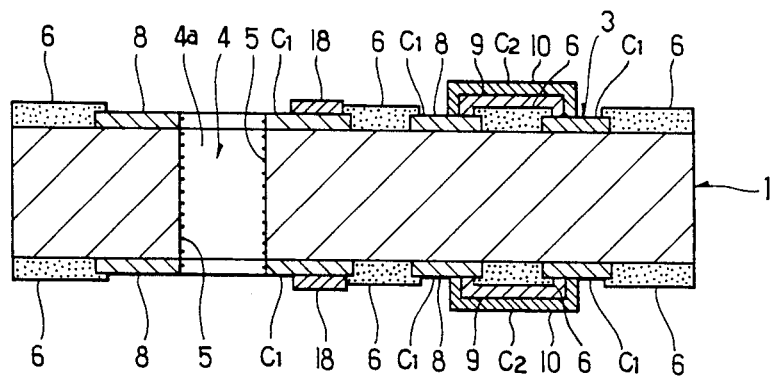
Figure 17:
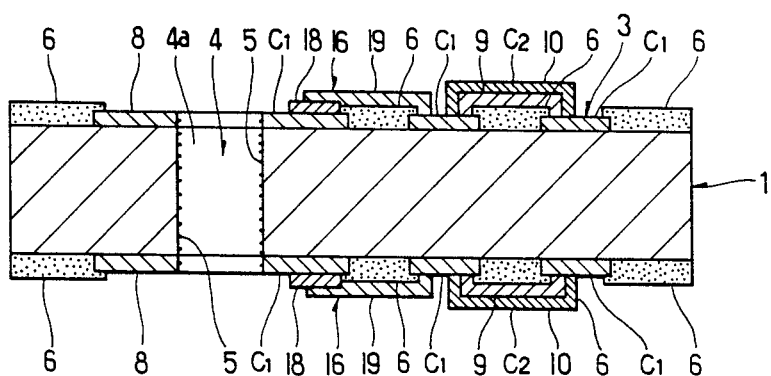
Figure 18:
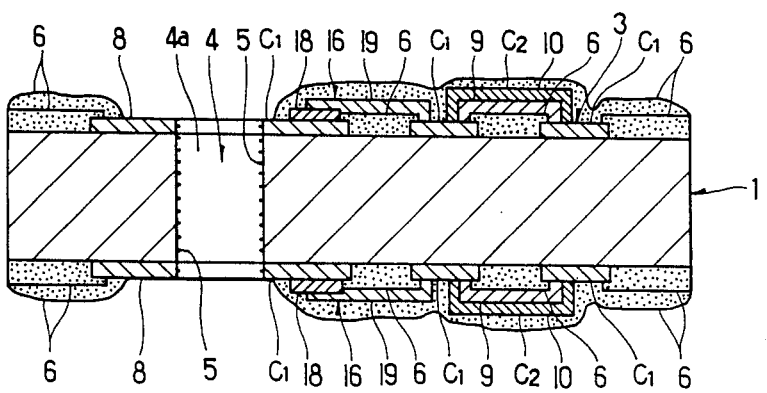
Figure 19:
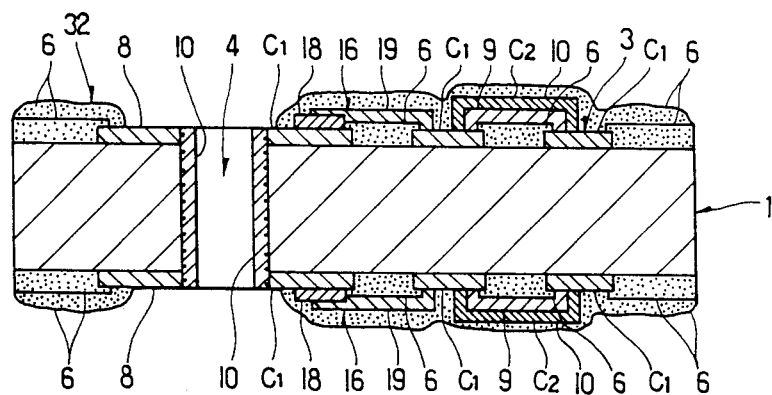

In reference to FIG. 16, a dielectric paste 18 is coated on a part of a circuit $C_1$ of first lamination or of a circuit $C_2$ of second lamination on each side of the copper laminated base board 3, and then is heated to be hardened. Then as shown in FIG. 17, an electrically conductive paste 19 such as a silver paste is coated on both sides of the copper laminated base board 3 in a manner so as to electrically connect the dielectric paste 18 to another circuit $C_1$ spaced from the circuit $C_1$ on which the dielectric paste 18 is coated with the plating-resistant resist 6 being located therebetween, and then the electrically conductive paste 19 is heated to be hardened. Thus an electricity storing circuit 16 is formed on each side of the copper laminated base board 3. Then as shown in FIG. 18, the plating-resistant resist 6 is coated on both sides of the copper laminated base board 3 except the through-hole 4 and the circuits of first lamination located around the through-hole 4, and is then heated to be hardened. An activation treatment is then performed to the inner periphery 4a of the through-hole 4, and then a non-electrolytic plating is performed on the inner periphery 4a to form thereat the copper plating layer 10 to electrically connect the circuits $C_1$ each located around the through-hole 4 on both sides of the copper laminated base board 3 as shown in FIG. 19. Thus the circuits $C_1$, $C_2$ of at least four laminations including the electricity storing circuit 16 are formed on both sides of the copper laminated base board 3.

In FIG. 17 the electrically conductive paste 19 is connected only to the circuit $C_1$ on the right side of the plating-resistant resist 6 on each side of the base board 3. The electrically conductive paste 19 may however be connected to the circuit $C_2$ of second lamination.

In this way, the subtractive method and the additive method are properly combined to form the electrically conductive circuits $C_1$, $C_2$ of at least four laminations including the electricity storing circuit 16 on both sides of the copper laminated base board 3, and thus a print-circuit base board 32 is finished up as shown in FIG. 19.

In the embodiment, the circuits $C_1$, $C_2$ of first and second laminations are formed one on the other on each side of the copper laminated base board 3. The circuits are however not limited to the two lamination on each side of the base board 3. The same processes may be repeatedly performed on the plating-resistant resist 6 on each side of the base board 3 to form more than three laminations of circuits, that is, more than six laminations of circuits in all on both sides of the copper laminated base board 3.

Figure 20:
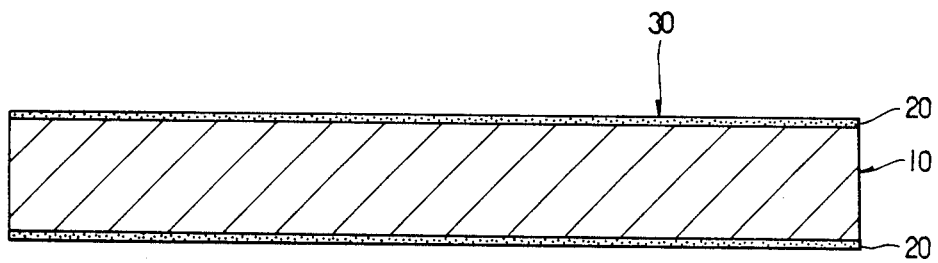
Figure 21:
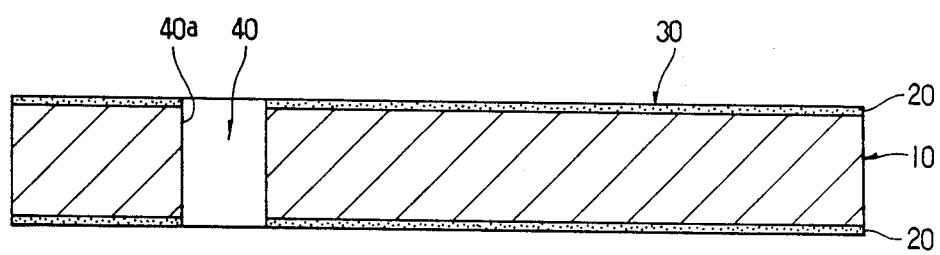
Figure 22:
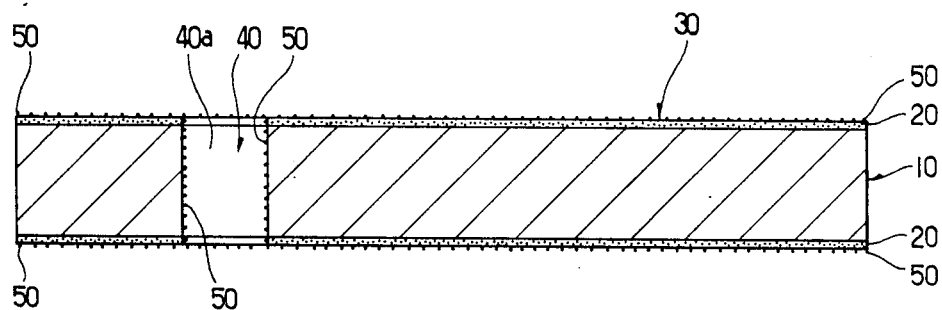

Now in reference to FIGS. 20 through 28, a fourth embodiment of the invention will be explained. A polymer base board 10 has an adhesive 20 applied on both sides thereof, and thus an adhesive-applied base board 30 is provided as shown in FIG. 20. The adhesive-applied base board 30 is processed to have a through-hole 40 having an inner periphery 40a extending all through the thickness thereof as shown in FIG. 21. The adhesive-applied base board 30 is then subjected to a catalyst treatment, and then metal particles 50 are attached on both sides of the base board and on the inner periphery 40a of the through-hole 40 as shown in FIG. 22. The metal particles 50 may be palladium (Pd) by way of example to be utilized as so many nucleuses for the subsequent non-electrolytic copper plating.

The catalyst treatment of the adhesive-applied base board 30 is made with a catalyst of palladium oxide ($Pdcl_2$) and tin chloride ($Sncl_2$) or an alkali catalyst solution of palladium only, and then metal particles 50 of palladium are attached on the surfaces of the adhesive-applied base board 30. The metal particles 50 are used as the nucleuses to expose the copper therearound in the subsequent non-electrolytic copper plating. Since both palladium and copper are a metal and little energy is required to provide a surface between the two substances and have the atomic arrangement of a substantially same period (both are of the face-centered cubic lattice and the lattice constants are approximating such as 3.8898 Å and 3.6150 Å respectively), the copper is progressively exposed on the colloid palladium in the non-electrolytic copper plating and thus the copper plating may be applied on the metal particles 50.

Figure 23:
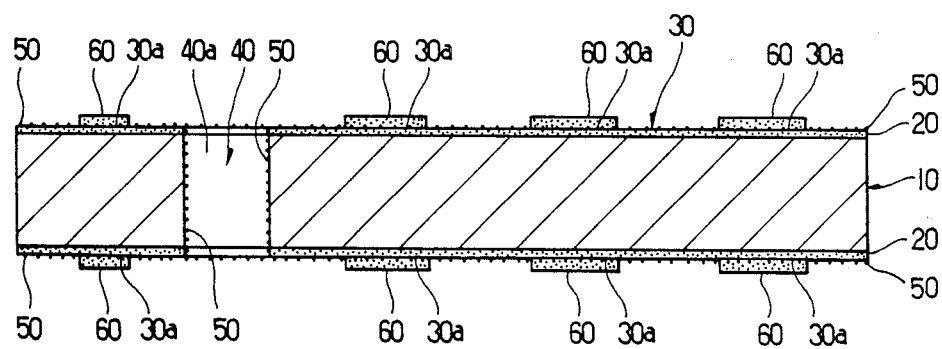
Figure 24:
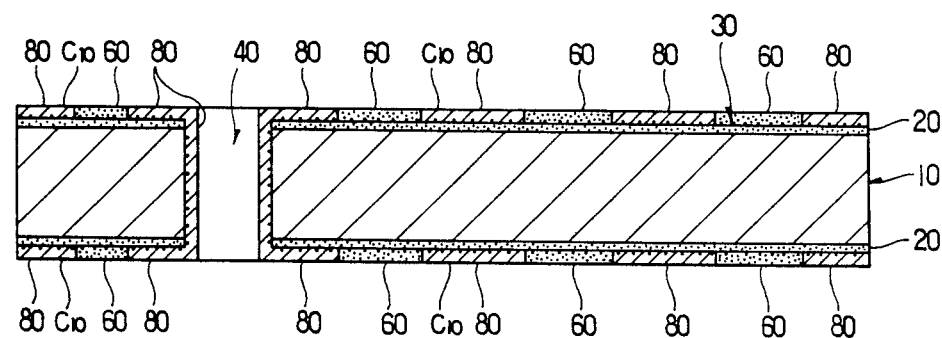

After the catalyst treatment is finished, a plating-resistant resist 60 such as the resist CR-2001 developed by Asahi Chemical Research Laboratory Co. is coated on both sides of the adhesive-applied base board 30 on the portions 30a where there are no circuits formed as shown in FIG. 23. The plating-resistant resist 60 is then heated at about 150° C. for about 30 minutes to be hardened. A non-electrolytic copper plating is performed on both sides of the adhesive-applied base board except the portions having the plating-resistant resist 60 is coated thereon, and on the inner periphery 40a of the through-hole 40 as shown in FIG. 24. With the non-electrolytic copper plating, a copper plating layer having the thickness of 1.0 $\mu$m-3.0 $\mu$m in an hour in a copper plating bath of a temperature of about 70° C., pH12 though the mentioned values may be more or less varied in dependence upon the composition of the copper plating bath. The copper plating layer is practically required to have the minimum thickness of 5 $\mu$m, and the plating time will be 1.7-5 hours. Thus a copper plating layer 80 is provided in formation of the circuits $C_{10}$ of first lamination on both sides of the adhesive-applied base board 30. The circuits $C_{10}$ of the first lamination are electrically connected to each other on both sides of the base board 30 through the copper plating layer 80 of the inner periphery 40a of the through-hole 40.

Figure 25:
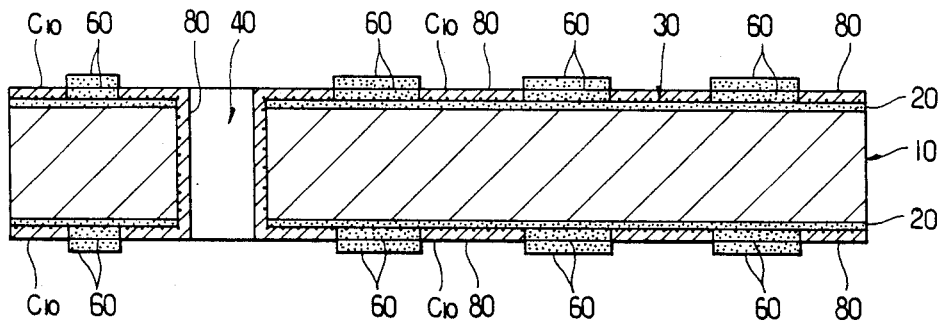

The plating-resistant resist 60 is again coated on both sides of the adhesive-applied base board 30 on the portions where the plating-resistant resist 60 was precededly coated or on parts of the circuits $C_{10}$ of first lamination which will not be electrically connected to the circuits of second lamination which will be mentioned herein as shown in FIG. 25, and the resist 60 is heated to be hardened.

Figure 26:
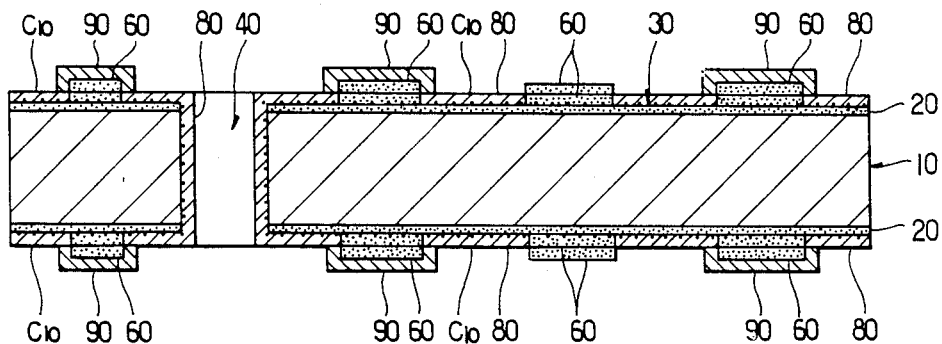

Subsequently as shown in FIG. 26, an electrically conductive copper paste 90 such as the paste ACP-007P developed by Asahi Chemical Research Laboratory Co., Ltd. which is specifically adapted to a copper plating, is coated by way of screen printing on the portions having the plating-resistant resist 60 is repeatedly coated thereon on both sides of the adhesive-applied base board, and then is heated at the temperature of about 150° C. for 30-60 minutes to be hardened.

The adhesive-applied base board 30 is then processed with a pre-plating treatment. Namely the base board 30 is washed for several minutes with a water solution of 4-5% by weight of causic soda (NaOH) by way of example, and then is applied with a surface treatment for several minutes by means of a water solution of 5-10% by weight of hydrochloric acid (HCl). With this surface treatment, many copper particles are exposed on the surface of the electrically conductive copper paste 90 from among the binder-thereof, which may be used as the neucleuses in the subsequent process of copper plating. In this case, it is noted that the catalyst treatment is not needed which may otherwise be needed in the normal non-electrolytic copper plating.

Figure 27:
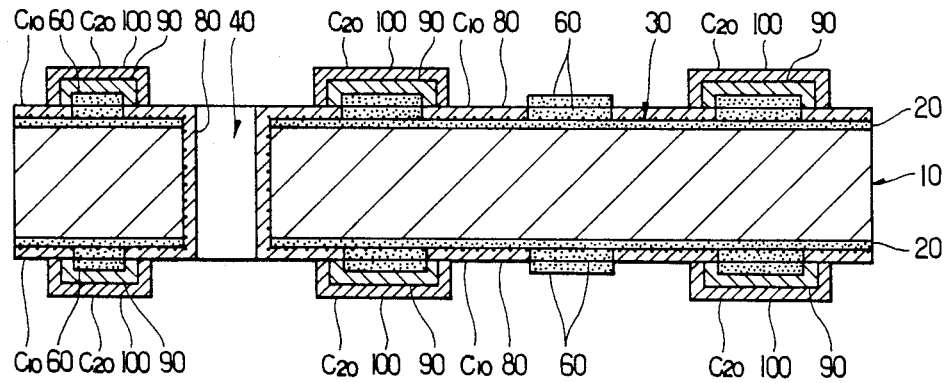

In the next place as shown in FIG. 27, the adhesive-applied base board 30 is immersed in a chemical copper placing bath to perform a chemical copper plating on the surface of the electrically conductive paste 90. As the result, copper plating layers 100 are provided in formation of the circuits $C_{20}$ of second lamination on both sides of the adhesive-applied base board. Thus the circuits $C_{20}$ of second lamination are electrically connected to the adjacent circuits $C_{10}$ of first lamination. This chemical copper plating bath is pH 11-13 and is of the temperature 65° C.-75° C., and the thickness of the copper plating layer 100 is more than 5 μm with a plating speed being 1.5 μm-3 μm per hour.

In this way, the circuits $C_{20}$ of second lamination may be formed with the copper plating layer 100 and the electrically conductive copper paste 90 on both sides of the adhesive-applied base board 30, and accordingly the circuits $C_{10}$, $C_{20}$ of at least four laminations may be formed on both sides of the base board 30.

Figure 28:
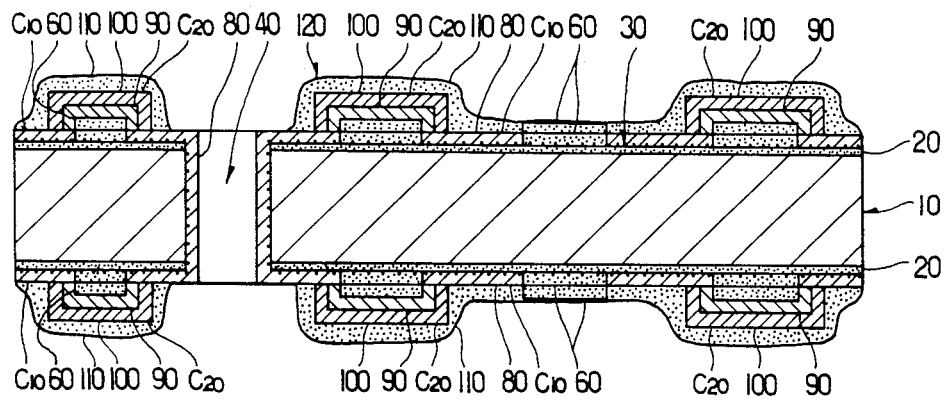

Finally as shown in FIG. 28, an overcoat 110 such as the plating-resistant resist CR-2001 developed by Asahi Chemical Research Laboratory Co., Ltd. is coated on both sides of the adhesive-applied base board 30, and thus a print-circuit base board 120 is finished up.

According to the embodiment, the circuits $C_{10}$, $C_{20}$ of at least four laminations may be formed on a single base board 30 by way of the additive method only.

Now in reference to FIG. 27 and FIGS. 29 through 31, a fifth embodiment of the invention will be explained. Since the embodiment is processed in the same menner with the fourth embodiment until the step of FIG. 27 is reached, this intermediate explanation is omitted herein, and only the steps from FIG. 28 to FIG. 31 will be explained with the same reference numerals used as to the parts which are common to both embodiments.

Figure 29:
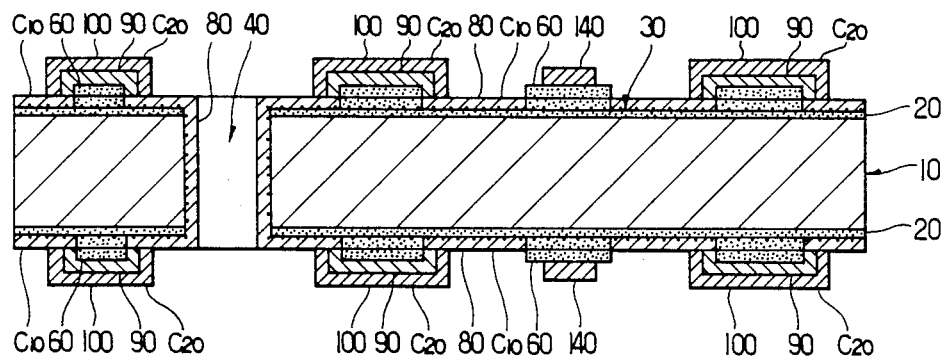
Figure 30:
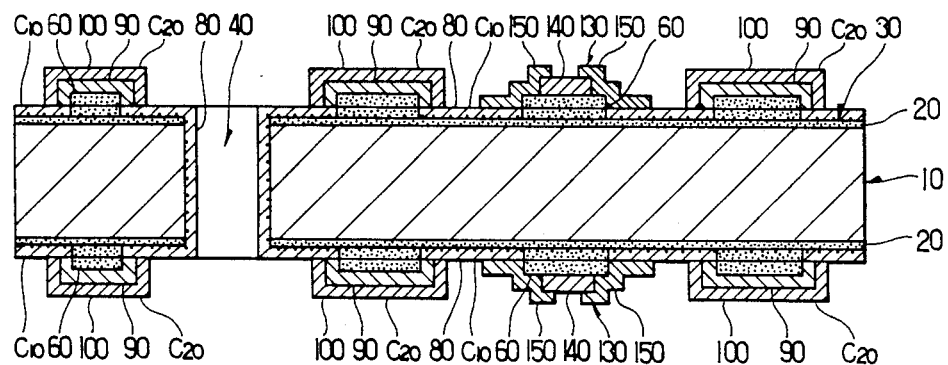
Figure 31:
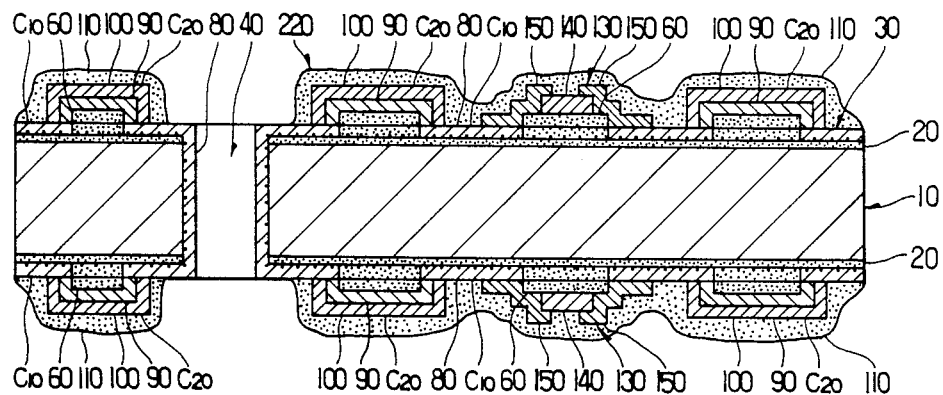

In reference to FIG. 29, a resistor paste 140 of a predetermined value of electric resistance is coated on the portions of plating-resistant resist 60 having no electrically conductive copper paste 90 coated thereon on both sides of the adhesive-applied base board 30, and the resistor paste 140 is then heated to be hardened. An electrically conductive paste 150 such as a silver paste is then coated on both sides of the base board 30 in a manner as to electrically connect to the resistor paste 140 at least two circuits $C_1$ of first lamination located on both sides of the resistor paste 140, and the electrically conductive paste 150 is then heated to be hardened as shown in FIG. 30. Thus a resistor circuit 130 is formed on each side of the adhesive-applied base board 30 in addition to the circuits $C_{10}$, $C_{20}$ of first and second laminations formed at least in fou laminations. Then the overcoat 110 is coated on both sides of the adhesive-applied base board 30. Thus a print-circuit board 220 is finished up as shown in FIG. 31 by the additive method only.

Now in reference to FIG. 27 and FIGS. 32 through 34, a sixth embodiment of the invention will be explained. Since the embodiment is processed in the same manner with the fifth embodiment until the step of FIG. 27 is reached, this intermediate explanation is omitted herein, and only the steps from FIG. 32 to FIG. 34 will be explained with the same reference numerals used as to the parts which are common to both embodiments.

Figure 32:
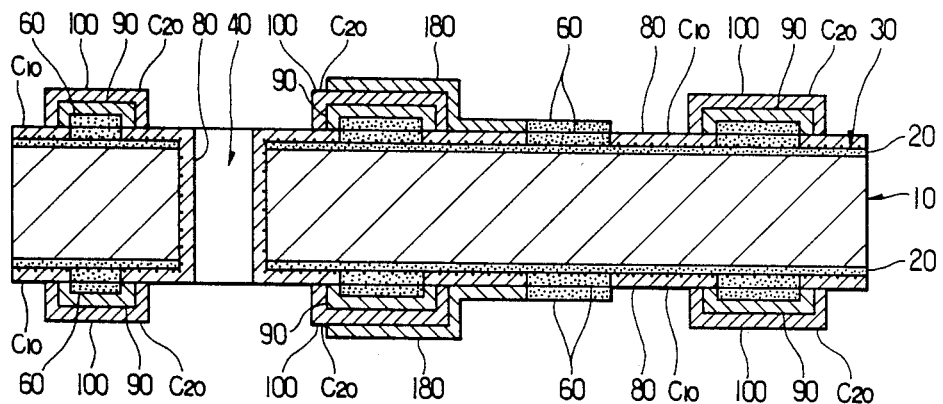
Figure 33:
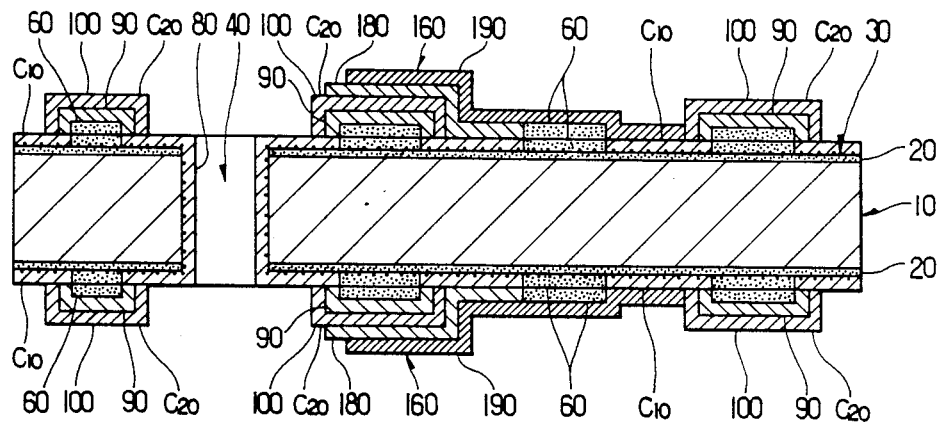

In reference to FIG. 32, a dielectric paste 180 having a property of storing electricity is coated on a part of one of the circuits $C_{10}$, $C_{20}$ of first and second laminations on both sides of the adhesive-applied base board 30, and then is heated to be hardened. An electrically conductive paste 180 such as a silver paste is coated on both sides of the adhesive-applied base board 30 in a manner as to electrically connect to the dielectric paste 180 another circuit $C_{10}$ of first lamination on each side of the base board 30, and the electrically conductive paste 190 is then heated to be hardened. In this way, an electricity storing circuit 160 is formed on each side of the adhesive-applied base board 30 in addition to the circuits $C_{10}$, $C_{20}$ of at least four laminations on both sides of the adhesive-applied base board 30.

In this embodiment, the electrically conductive paste 190 is used to electrically connect to the dielectric paste 180 the circuits $C_{10}$ and $C_{20}$ of first and second laminations located on the right side of the plating-resistant resist 60. It is however needless to say that one of the circuits $C_{10}$, $C_{20}$ of the first and second lamination may be connected to the dielectric paste 180.

Figure 34:
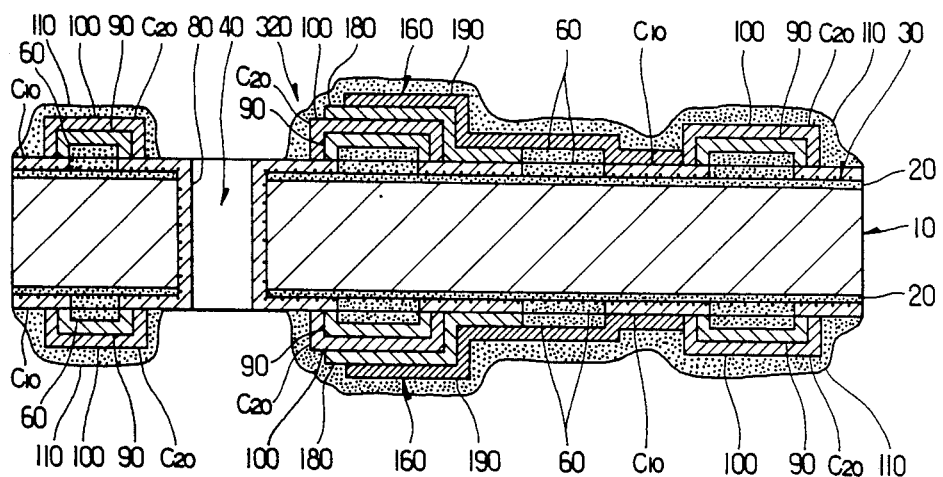

Finally as shown in FIG. 34, an overcoat 110 is coated on both sides of the adhesive-applied base board 30 and is then heated to be hardened. Thus a print-circuit board 320 is finished up.

In the embodiment, the circuits $C_{10}$, $C_{20}$ are formed in two laminations on each side of the adhesive-applied base board 30. It is however needless to say that the same processes may be repeated on the overcoat 110 to further increase the laminations of circuits, for example, into more than six laminations of circuits in all.

Further it would be necessary to briefly explain the electrically conductive copper paste, the electrically resistant paste, the plating resistant paste and the dielectric paste which are used in this invention.

As to the paste ACP-007P developed by Asahi Chemical Research Laboratory Co., Ltd. by way of example for an electrically conductive copper paste which is specifically adapted to a copper plating, it is generally known that copper is easily oxidized, and more especially copper in the condition of powder particles may be more easily oxidized because the exposed outer surface is enlarged. In contrast to the non-oxidizable paste of precious metals, it becomes necessary to provide a paste of such ingredients as to remove the oxidized film of the copper powder particles and also to prevent the reoxidization of the copper particles. In order to provide an electrically conductive copper paste which may be easily used and easily secured to a base material, it is important to properly select and easily secured to a base material, it is important to properly select and properly mix the ingredients such as copper powder, binder, special additive (for example, anthracene, anthracene carboxylic acid, anthradine, anthranilic acid), dispersant and solvent.

The copper particles are different in the configuration thereof depending upon the production method thereof. In the electrolytic method, the copper particles are deposited in high purity and also in branched shapes. In the reduction method wherein the oxides are reduced by a reducing gas, the copper particles are provided in spongy and porous shapes.

The electrically conductive copper paste to be used in connection with this invention is required to have the following properties:

1. To be easily coated by way of screen printing in formation of fine patterns.
2. Fixedly secured to the base board.
3. To be resistant against a high temperature alkali bath of copper chemical plating.
4. Fixedly secured to the copper plating.
5. Having an invariable viscosity in the elapse of time to maintain a stabilized printability.

In order to satisfy the above mentioned requirements the electrically conductive copper paste is required to contain the copper particles of high purity in the branch shapes as deposited by the electrolysis and/or the copper particles of porous spongy shapes as reduced from the metal oxides. The copper particles may be processed into flakes.

Further in order to highten the content rate of the copper particles in the paste, it is required to fill the copper particles of different sizes and shapes to a maximum density.

As to the binder of the electrically conductive copper paste, the binder is required to act as a vehicle for so much copper particles and as an effective adhesive to the base board. Further the binder must resist against the alkali bath of a copper chemical plating.

It was found that the electrically conductive copper paste was best when the copper paste contained the epoxy resin which has a larger content rate of copper particles and hightens the deposition rate of the plating, and further increases the adhesive property of the plating film.

With respect to the property of the copper plating deposited on the electrically conductive copper paste ACP-007P, the copper plating is reddish brown and paste like and has a viscosity of 300-500ps at the temperature of 25° C. The adhesive property to a copper laminated base board and to a resin base board has been confirmed by a taping test. Further the adhesive property to the electrically conductive paste has been confirmed by the taping test. The soldering property is more than 96% as to the extension rate and is more than 3.0 kg as to the tensile force ($3 \times 3$ mm$^2$).

The components of the electrically conductive copper paste and the conductivity thereof are mentioned in detail in the same applicant's Japanese Patent applications Nos. 55-6609 (laid open: 56-103260) (corresponding U.S. Pat. No. 4,353,816) and 60-216041 (corresponding U.S. Patent application of Ser. No. 06/895,716), and therefore the description thereof is omitted herein.

With respect to the electrically resistant paste, the paste contains a refined powder of carbon or graphite or the like of high purity as an electrically conductive element and a heat hardened resin such as epoxy resin, phenol resin, melamine resin, acrylic resin or the like as a binder, and further contains, as a viscosity modifier, a solvent which is evaporated slowly at a high temperature.

The components of the electrically resistant paste are each required to have a specific property. For example, as the functional powder, the particles must be fine and uniform and further of high purity as well as high quality. Further the particles must be of little difference in the electric resistance value and must be familiar with the resin to be mixed therewith.

As to the property of polymer, it is preferable that the paste is easily dissolved with the particles and will not be filmy if placed for a long time in a normal temperature. The paste further is required to be not hardened at a normal temperature and to be quickly hardened when heated. The hardened paste must not be vary in volume and must be slightly flexible and further easily adhesive to the base board. Further the paste must be resistant against heat and humidity, and also must be easily adhesive to the undercoat as will as to the overcoat.

As to the property of solvent, the paste is required to be stabilized in the successive printing operations, that is, not to fill the prints and not be deteriorate the emulsion film. The paste is further required to be slow in the evaporation speed at a normal temperature and reluctant to absorb water, not to abruptly change the viscosity thereof at the temperature $\pm 10°$ C. and to have no poison and/or irritating smell at a normal temperature and in the vapor at the time of heating.

The electrically resistant paste such as the paste TU-1K has been developed by Asahi Chemical Research Laboratory Co., Ltd. so as to fully satisfy the requirements as mentioned above. The electrically resistant paste maintains very stabilized resistance, that is, the resistance variation rate is only about 0.5% at the soldering temperatures at 240° C. Further the paste will not abruptly absorb the heat and will not respond to the heat until the soldering temperature is reached as actually indicated by a heat difference analysis curve, and therefore the volume variation of the resistor is extremely small.

With respect to the plating resistant resist such as the resist CR-2001 developed by Asahi Chemical Research Laboratory Co., Ltd. so as to be used in the present invention, this resist is coated on a first circuit which is not electrically connected to a second circuit which is to be formed on the first circuit. Therefore the resist is required to have an isolating property and at the same time an alkali resistant property. Actually the resist has been developed to maintain the acidity more than 4 hours in the alkali bath of 70° C. and of pH12 just like the copper chemical plating bath.

Similar to the electrically conductive copper paste ACP-007P, the resist contains as a main component an epoxy resin and is printed through a 180-mesh polyester screen and then is heated for 30 minutes at the temperature 150° C. so as to be hardened. The printing film is preferably 15–30 μm so as to resist chemicals and voltages. The main features are as follows: The resist is easily adhered to the base on which the resist is coated, and to a copper lamination and further is not deteriorated is immersed in the alkali bath of pH12 for a long time. The resist is quite safe in the practical use because the hardener to be used is alkali having little poison. The resist is coated by way of screen printing and has a hardener 10 g mixed with the principal component 100 g thereof, and is hardened in a set time 15–30 minutes at the temperature 150°–200° C.

The plating resistant resist is green in the condition of ink and has an adhesion (cross-cut) 100/100 on a copper lamination, a surface hardness of more than 8H when measured by a pencil, a solvent resistant property (in trichloroethylene) by more than 15 sec., a soldering heat (260° C.) resistant property of more than 5 cycles, a surface isolation resistance value of more than $5 \times 10^{13} \Omega$, a volume resistance value of $1 \times 10^{14} \Omega$-cm, a voltage (15 μm) resistant property of more than 3.5 kV and a dielectric tangent (1 $MH_z$) of less than 0.03.

The dielectric paste to be used in the invention has been developed as corresponding to the types 1 and 2 of the chip condenser standards, and the electrostatic capacity is 100pF–1000pF. The dielectric paste is produced from the barium titanate ($BaTiO_3$) which is burned into flakes or into a plate and is ground into particles of 2 μm–10 μm which are then mixed with a binder with more than 50% by weight of the particles, which are further mixed with an organic solvent and is kneaded into a paste. For a binder, a resin such as phenol resin, epoxy resin, melamine resin, et., may be used. For a solvent, butyl carbithol may be used as a main element together with carbithol or butyl cellsole.

EXAMPLE 1

The electrically conductive copper paste ACP-007P was directly printed on a paper phenol base board and heated at the temperature of 150° C. for a predetermined time so as to be hardened. Then the alkali and acid treatment was performed to the base board and subsequently the chemical copper.plating was performed to provide a chemical copper plating layer of 6 μm thickness. A lead (tin coated lead 0.5 mmφ) was soldered (within 3 seconds) to the measuring terminal. In this case, it was found that the solder tensile strength (kg/3×3 mm²) was 5.1 kg when the paste was hardened in 30 minutes, and 5.9 kg when the paste was hardened in 60 minutes.

In case a glass epoxy resin base board was emplyed on the same condition, it was found that the tensile strength was 5.9 kg when the paste was hardened in 30 minutes, and 6.2 kg when the paste was hardened in 60 minutes.

EXAMPLE 2

The plating-resistant resist CR-2001 was printed on a phenol resin base board and was heated at the temperature of 150° C. for 30 minutes so as to be hardened. Subsequently the electrically conductive copper paste ACP-007P was printed and heated at the temperature of 150° C. for a predetermined time so as to be hardened. Then the alkali and acid treatment was performed, and then the chemical copper plating was performed to provide a copper plating layer of 6 μm thickness. A lead (tin coated lead 0.5 mmφ) was soldered (within 3 seconds) to the measuring terminal. In this case, it was found that the solder tensile strength (kg/3×3 mm²) was 5.9 kg when the paste was hardened in 30 minutes, and 6.1 kg when the paste was hardened in 60 minutes.

In case a glass epoxy resin base board was employed on the same condition, it was found that the solder tensile strength was 6.1 kg when the paste was hardened in 30 minutes, and 6.9 kg when the paste was hardened in 60 minutes.

What is claimed is:

1. A method for forming electrically conductive circuits on a base board comprising the steps of:
   (a) attaching copper laminations on both sides of said base board to provide a copper laminated base board;
   (b) processing said copper laminated base board to provide a through-hole extending all through the thickness of said copper laminated base board;
   (c) performing a catalyst treatment of said copper laminated base board;
   (d) washing said copper laminated base board;
   (e) etching both sides of said copper laminated base board to form thereon a plurality of circuits of first lamination including a circuit formed around said through-hole on each side of said copper laminated base board;
   (f) coating a plating-resistant resist on both sides of said copper laminated base board except the circuits of first lamination;
   (g) heating said copper laminated base board to harden said plating-resistant resist;
   (h) coating an electrically conductive copper paste on both sides of said copper laminated base board in a manner as to electrically connect at least two circuits of first lamination on each side of said copper laminated base board;
   (i) heating said copper laminated base board to harden said electrically conductive copper paste;
   (j) making a pre-plating treatment to said copper laminated base board
   (k) performing a chemical copper plating on the surface of said electrically conductive paste of said copper laminated base board to provide thereat a circuit of second lamination on each side of said copper laminated base board;
   (l) coating said plating-resistant resist on both sides of said copper laminated base board except a part of said circuits of first lamination formed around said through-hole;
   (m) heating said copper laminated base board to harden said plating-resistant resist; periphery of said through-hole; and
   (n) performing an activation treatment to the inner periphery of said through-hole; and
   (o) performing a non-electrolytic copper plating on said inner periphery of said through-hole to provide thereat a copper plating layer to electrically connect said circuits of first lamination on both sides of said copper laminated base board.

2. A method for forming electrically conductive circuits on a base board comprising the steps of:
   (a) attaching copper laminations on both sides of said base board to provide a copper laminated base board;
   (b) processing said copper laminated base board to provide a through-hole extending all through the thickness of said copper laminated base board;

(c) performing a catalyst treatment of said copper laminated base board;
(d) washing said copper laminated base board;
(e) etching both sides of said copper laminated base board to form thereon a plurality of circuits of first lamination including a circuit formed around said through-hole on each side of said copper laminated base board;
(f) coating a plating-resistant resist on both sides of said copper laminated base board except said circuits of first lamination;
(g) heating said copper laminated base board to harden said plating-resistant resist;
(h) coating an electrically conductive copper paste on both sides of said copper laminated base board in a manner as to electrically connect at least two circuits of first lamination on each side of said coppe laminated base board;
(i) heating said copper laminated base board to harden said electrically conductive copper paste;
(j) making a pre-plating treatment to said copper laminated base board;
(k) performing a chemical copper plating on the surface of said electrically conductive copper paste of said copper laminated base board to provide thereat a circuit of second lamination on each side of said copper laminated base board;
(l) coating a resistor paste on said plating-resistant resist of a predetermined electric resistance value on both sides of said copper laminated base board;
(m) heating said copper laminated base board to harden said resistor paste;
(n) coating an electrically conductive paste on both sides of said copper laminated base board in a manner as to electrically connect to said resistor paste at least two of said circuits of first lamination located on both sides of said resistor paste or said circuit of second lamination located on one side of said resistor paste on each side of said copper laminated base board;
(o) heating said copper laminated base board to harden said electrically conductive paste to form thereat a resistor circuit on each side of said copper laminated base board;
(p) coating said plating-resistant resist on both sides of said copper laminated base board except a part of said circuits of first lamination formed around said through-hole;
(q) heating said copper laminated base board to harden said plating-resistant resist;
(r) performing an activation treatment to the inner periphery of said through-hole; and
(s) performing a non-electrolytic copper plating on said inner periphery of said through-hole to provide thereat a copper plating layer to electrically connect said circuits of first lamination on both sides of said copper laminated base board.

3. A method for forming electrically conductive circuits on a base board comprising the steps of:
(a) attaching copper laminations on both sides of said base board to provide a copper laminated base board;
(b) processing said copper laminated base board to provide a through-hole extending all through the thickness of said copper laminated base board;
(c) performing a catalyst treatment of said copper laminated base board;
(d) washing said copper laminated base board;
(e) etching both side of said copper laminated base board to form thereon a plurality of circuits of first lamination including a circuit formed around said through-hole on each side of said copper laminated base board;
(f) coating a plating-resistant resist on both sides of said copper laminated base board except said circuits of first lamination;
(g) heating said copper laminated base board to harden said plating-resistant resist;
(h) coating an electrically conductive copper paste on both sides of said copper laminated base board in a manner as to electrically connect at least two circuits of first lamination on each side of said copper laminated base board;
(i) heating said copper laminated base board to harden said electrically conductive copper paste;
(j) making a pre-plating treatment to said copper laminated base board;
(k) performing a chemical copper plating on the surface of said electrically conductive copper paste of said copper laminated base board to provide thereat a circuit of second lamination on each side of said copper laminated base board;
(l) coating a dielectric paste having a property of storing electricity on a part of one of said circuits of first lamination or of second lamination on each side of said copper laminated base board;
(m) heating said copper laminated base board to harden said dielectric paste;
(n) coating an electrically conductive paste on both sides of said copper laminated base board in a manner as to electrically connect to said dielectric paste one of said circuits of first lamination located adjacent thereto or said circuit of second lamination on each side of said copper laminated base board;
(o) heating said copper laminated base board to harden said electrically conductive paste to form thereat an electricity storing circuit on each side of said copper laminated base board;
(p) coating said plating-resistant resist on both sides of said copper laminated base board except a part of said circuits of first lamination formed around said through-hole;
(q) heating said copper laminated base board to harden said plating-resistant resist;
(r) performing an activation treatment to the inner periphery of said through-hole; and
(s) performing a non-electrolytic copper plating on said inner periphery of said through-hole to provide thereat a copper plating layer to electrically connect said circuits of first lamination on both sides of said copper laminated base board.

4. A method for forming electrically conductive circuits on a base board comprising the steps of:
(a) applying an adhesive on both sides of said base board to provide an adhesive-applied base board;
(b) processing said adhesive-applied base board to provide a through-hole extending all through the thickness of said base board;
(c) performing a catalyst treatment of said base board;
(d) coating a plating-resistant resist on predetermined portions on both sides of said base board;
(e) heating said base board to harden said plating-resistant resist;
(f) performing a non-electrolytic copper plating on the portions having no plating-resistant resist coated thereon on both sides of said base board, and on the inner periphery of said through-hole, to hereby provide thereat a copper plating layer in formation of a plurality of circuits of first lamination which are electrically connected to each other on both sides of said base board;

(g) coating said plating-resistant resist on at least the portions having said plating-resistant resist coated thereon on both sides of said base board;

(h) heating said base board to harden said plating-resistant resist;

(i) coating an electrically conductive copper paste on said portions having said plating-resistant resist repeatedly coated thereon;

(j) heating said base board to harden said electrically conductive copper paste;

(k) performing a pre-plating treatment of said base board; and (l) performing a chemical copper plating on the surface of said electrically conductive copper paste to provide therat a plurality of circuits of second lamination on both sides of said base board.

5. A method for forming electrically conductive circuits on a base board comprising the steps of:

(a) applying an adhesive on both sides of said base board to provide an adhesive-applied base board;

(b) processing said adhesive-applied base board to provide a through-hole extending all through the thickness of said base board;

(c) performing a catalyst treatment of said base board;

(d) coating a plating-resistant resist on predetermined portions on both sides of said base board;

(e) heating said base board to harden said plating-resistant resist;

(f) performing a non-electrolytic copper plating on the poritons having no plating-resistant resist coated thereon on both sides of said base board, and on the inner periphery of said through-hole, to thereby provide thereat a copper plating layer in formation of a plurality of circuits of first lamination which are electrically connected to eah other on both sides of said base board;

(g) coating said plating-resistant resist on at least the portions having said plating-resistant coated thereon on both sides of said base board;

(h) heating said base board to harden said plating-resistant resist;

(i) coating an electrically conductive copper paste on said portions having said plating-resistant resist repeatedly coated thereon;

(j) heating said base board to harden said electrically conductive copper paste;

(k) performing a pre-plating treatment of said base board;

(l) performing a chemical copper plating on the surface of said electrically conductive copper paste to provide thereat a plurality of circuits of second lamination on both sides of said base board;

(m) coating a resistor paste having a predetermined value of electric resistance on at least one of the portions having said plating-resistant resist coated thereon on each side of said base board;

(n) heating said base board to harden said resistor paste;

(o) coating an electrically conductive paste on both sides of said base board in a manner as to electrically connect to said resistor paste the circuits of first or second lamination located on both sides of said resistor paste on each side of said base board; and (p) heating said base board to harden said electrically conductive paste to form a resistor circuit on each side of said base board.

6. A method for forming electrically conductive circuits on a base board comprising the steps of:

(a) applying an adhesive on both sides of said base board to provide an adhesive-applied base board;

(b) processing said adhesive-applied base board to provide a through-hole extending all through the thickness of said base board;

(c) performing a catalyst treatment of said base board;

(d) coating a plating-resistant resist on predetermined portions on both sides of said base board;

(e) heating said base board to harden said plating-resistant resist;

(f) performing a non-electrolytic copper plating on the portions having no plating-resistant resist coated thereon on both sides of said base board, and on the inner periphery of said through-hole, to thereby provide therat a copper plating layer in formation of a plurality of circuits of first lamination which are electrically connected to each other on both sides of said base board;

(g) coating said plating-resistant resist on at least the portions having said plating-resistant resist coated thereon on both sides of said base board;

(h) heating said base board to harden said plating-resistant resist;

(i) coating an electrically conductive copper paste on said portions having said plating-resistant resist repeatedly coating thereon;

(j) heating said base board to harden said electrically conductive copper paste;

(k) performing a pre-plating treatment of said base board;

(l) performing a chemical copper plating on the surface of said electrically conductive copper paste to provide thereat a plurality of circuits of second lamination on both sides of said base board;

(m) coating a dielectric paste having a property of storing electricity on a part of one of said circuits of first or second lamination on each side of said bse board;

(n) heating said base board to harden said dielectric paste;

(o) coating an electrically conductive paste on both sides of said base board in a manner as to electrically connect to said dielectric paste at least one of said circuits of first or second lamination located adjacent to said dielectric paste; and (p) heating said base board to harden said electrically conductive paste to form thereat an electricity storing circuit on each side of said base board.

* * * * *

UNITED STATES PATENT AND TRADEMARK OFFICE
CERTIFICATE OF CORRECTION

PATENT NO. : 4,735,676
DATED       : April 5, 1988
INVENTOR(S) : Yamahiro Iwasa

It is certified that error appears in the above-identified patent and that said Letters Patent is hereby corrected as shown below:

Claim 1, line 30, after "base board" insert --;--; and lines 41 and 42, delete "periphery of said through-hole; and".

Claim 2, line 25, change "coppe" to --copper--.

Claim 4, line 35, change "therat" to --thereat--.

Claim 5, line 19, change "eah" to --each--; and line 22, after "plating-resistant" insert --resist--.

Claim 6, line 17, change "therat" to --thereat--; and line 39, change "bse" to --base--.

Signed and Sealed this

Second Day of August, 1988

*Attest:*

DONALD J. QUIGG

*Attesting Officer*  *Commissioner of Patents and Trademarks*